(12) United States Patent
Tsai et al.

(10) Patent No.: US 6,229,460 B1
(45) Date of Patent: May 8, 2001

(54) METHOD OF GENERATING A SYMMETRICAL REVERSIBLE VARIABLE LENGTH CODE

(75) Inventors: Chien-Wu Tsai; Ja-Ling Wu, both of Taipei; Shu-Wei Liu, Kaohsiung Hsien, all of (TW)

(73) Assignee: Cyberlink Corporation (TW)

( * ) Notice: Subject to any disclaimer, the term of this patent is extended or adjusted under 35 U.S.C. 154(b) by 0 days.

(21) Appl. No.: 09/442,167

(22) Filed: Nov. 16, 1999

(30) Foreign Application Priority Data

Aug. 11, 1999 (TW) ................................................ 88113718

(51) Int. Cl.$^7$ ...................................................... H03M 7/40
(52) U.S. Cl. ...................................................... 341/67
(58) Field of Search ............................................ 341/50, 67

(56) References Cited

U.S. PATENT DOCUMENTS 5,488,616 * 1/1996 Takishima ............................ 341/82

OTHER PUBLICATIONS

Takishima et al., Reversible Variable Lenght Codes, 1995, IEEE Transactions on Communications vol. 43, No. 2/3/4, pp. 158–162.*

* cited by examiner

Primary Examiner—Howard L. Williams
(74) Attorney, Agent, or Firm—Fish & Richardson P.C.

(57) ABSTRACT

A method of generating a symmetrical reversible variable length code. This symmetrical reversible variable length code is derived from an original variable length code. Compared with the conventional generating method, the novel method is independent of the bit alignment patterns of the codeword of the original variable length code. In addition, the assignment of codewords of the symmetrical reversible variable length code is performed by a selection priority. Therefore, the overall coding efficiency is improved.

5 Claims, 4 Drawing Sheets

FIG. 4

| LETTERS | OCCURRENCES | C1 | | C2 | | C3 | | C4 | | C5 | |
|---|---|---|---|---|---|---|---|---|---|---|---|
| | | L | CODEWORD | L | CODEWORD | L | CODEWORD | L | CODEWORD | L | CODEWORD |
| E | 0.14878570 | 3 | 001 | 3 | 000 | 3 | 010 | 3 | 001 | 3 | 010 |
| T | 0.09354149 | 3 | 110 | 3 | 111 | 3 | 101 | 3 | 110 | 3 | 101 |
| A | 0.08833733 | 4 | 0000 | 4 | 0110 | 4 | 0110 | 4 | 0000 | 4 | 0110 |
| O | 0.07245769 | 4 | 0100 | 4 | 1001 | 4 | 1001 | 4 | 0100 | 4 | 1001 |
| R | 0.06872164 | 4 | 0101 | 5 | 00100 | 4 | 0000 | 4 | 0110 | 4 | 0000 |
| N | 0.06498532 | 4 | 0110 | 5 | 11011 | 4 | 1111 | 4 | 1000 | 4 | 1111 |
| H | 0.05831331 | 4 | 1000 | 5 | 01010 | 5 | 01110 | 4 | 1010 | 5 | 01110 |
| I | 0.05644515 | 4 | 1001 | 5 | 10101 | 5 | 10001 | 4 | 1110 | 5 | 10001 |
| S | 0.05537763 | 4 | 1010 | 5 | 01110 | 5 | 00100 | 4 | 0101 | 5 | 00100 |
| D | 0.04376834 | 5 | 00010 | 5 | 10001 | 5 | 11011 | 5 | 00010 | 5 | 11011 |
| L | 0.04123298 | 5 | 00011 | 6 | 001100 | 6 | 011110 | 5 | 10110 | 6 | 011110 |
| U | 0.02762209 | 5 | 10110 | 6 | 110011 | 6 | 100001 | 5 | 10010 | 6 | 100001 |
| P | 0.02575393 | 5 | 10111 | 6 | 010010 | 6 | 001100 | 5 | 11110 | 6 | 001100 |
| F | 0.02455297 | 5 | 11100 | 6 | 101101 | 6 | 110011 | 5 | 01111 | 6 | 110011 |
| M | 0.02361889 | 5 | 11110 | 6 | 011110 | 7 | 0111110 | 5 | 10111 | 7 | 0111110 |
| C | 0.02081665 | 5 | 11111 | 6 | 100001 | 7 | 1000001 | 5 | 11111 | 7 | 1000001 |
| W | 0.01868161 | 6 | 011100 | 7 | 0010100 | 7 | 0010100 | 6 | 000111 | 7 | 0010100 |
| G | 0.01521216 | 6 | 011101 | 7 | 1101011 | 7 | 1101011 | 6 | 011100 | 7 | 1101011 |
| Y | 0.01521216 | 6 | 011110 | 7 | 0011100 | 7 | 0011100 | 6 | 100110 | 7 | 0011100 |
| B | 0.01267680 | 6 | 011111 | 7 | 1100011 | 7 | 1100011 | 6 | 011101 | 7 | 1100011 |
| V | 0.01160928 | 6 | 011011 | 7 | 0100010 | 7 | 0001000 | 6 | 100111 | 7 | 0001000 |
| K | 0.00867360 | 7 | 1110100 | 7 | 1011101 | 7 | 1110111 | 6 | 0001100 | 7 | 1110111 |
| X | 0.00146784 | 8 | 11101011 | 8 | 00111100 | 8 | 01111110 | 8 | 00011011 | 8 | 01111110 |
| J | 0.00080064 | 9 | 111010101 | 9 | 001010100 | 9 | 011111110 | 9 | 000110101 | 9 | 011111110 |
| Q | 0.00080064 | 10 | 1110101000 | 10 | 0010110100 | 10 | 0111111110 | 10 | 0001101001 | 10 | 0111111110 |
| Z | 0.00053376 | 10 | 1110101001 | 10 | 1101001011 | 10 | 1000000001 | 10 | 0001101101 | 10 | 1000000001 |
| AVE. CODE LEN. | | 4.15572392 | | 4.69655649 | | 4.60728507 | | 4.15572392 | | 4.60728507 | |

METHOD OF GENERATING A SYMMETRICAL REVERSIBLE VARIABLE LENGTH CODE

BACKGROUND OF THE INVENTION

1. Field of the Invention

The present invention generally relates to a method of generating a symmetrical reversible variable length code.

2. Description of the Prior Art

Variable length codes (hereinafter called VLCs) can achieve higher compression efficiency by assigning codewords with variable code lengths to digital data with non-uniform probability distributions. There are many modern image and video coding standards, such as the JPEG still image coding standard, the ITU series of H.261 and H.263 video coding standards and the ISO series of MPEG-1 and MPEG-2 standards, adopting VLCs as the entropy coding stage. Due to the variable code length nature of VLCs, such schemes are very sensitive to errors in noisy environments. Even one single bit mismatch will cause a serious synchronous problem due to the propagation of errors. Moreover, there are more and more image and video applications being applied and developed in unreliable wireless environments at present time, and the trend will become more important and popular in the future. Therefore, suitable retransmission protocols for less time-constrained applications and adequate VLC code designs for critical time-constrained applications are the main issues for the applications operated in error-prone environments.

A new reversible variable length code (hereinafter called RVLC) has been proposed for the applications operated in the error-prone environments. RVLCs can be decoded both in the forward and backward directions. For example, when an error occurs in the normal forward decoding of a bit stream, the RVLC decoder then proceeds to the end of the bit stream and decodes it in the backward direction. In other words, bit synchronization will not be affected by the propagation of a single bit error. A lot of research topics, such as H.263+ and MPEG-4, pay extensive attention on RVLC. Y. Takishima, M. Wada and H. Murakami have proposed a symmetrical RVLC algorithm in the paper, "Reversible Variable Length Code" IEEE Trans. Comm., Vol.43, No.2/3/4, pp.158–163, 1995. The symmetrical RVLC algorithm proposed by Takishima et al. is described in detail as follows.

In this algorithm, the symmetrical RVLC is derived from a Huffman code. The Huffman code, in which digital data are assigned to codewords with optimal bit-lengths according to the known probability distribution of various symbols, is a non-reversible VLC. A RVLC must satisfy both the prefix condition and the suffix condition for instantaneous forward and backward decoding, respectively. If the RVLC satisfies the prefix (or suffix) condition, it means that each codeword does not coincide with the prefixes (or suffixes) of longer codewords. For example, the codeword "1001", which is the prefix of the codeword "100111 (4 bits), does not satisfy the prefix condition. Before discussing this algorithm, some mathematical functions and the codeword properties are described first.

FIG. 1 (Prior Art) is a diagram of a binary tree for illustrating symmetrical codes and non-symmetrical codes. The binary tree begins at root R. Nodes of the next level in the binary tree are obtained by appending a bit of "0" or "1," where appending "0" and "1" can generate a new code on the left side and on the right side, respectively. In FIG. 1, there are five levels, denoted by L1~L5, in this binary tree. The nodes on these levels correspond to codes with the code lengths from 1 to 5, respectively. For a symmetrical code, such as 11011 (node 5g), the bit sequences read from left to right and from right to left are the same. On the contrary, the non-symmetrical codeword, such as 10011, does not possess such bit sequence property. In FIG. 1, the nodes corresponding to symmetrical codes are represented by full circles and the nodes corresponding to non-symmetrical codes are represented by empty circles. If all codewords of a VLC are symmetrical, the VLC is reversible. Reversibility means that digital data can be decoded in the forward direction or in the backward direction. The number of the codes that have length L and can be instantaneously decoded, denoted by m(L), is determined as follows.

On a full binary tree as illustrated in FIG. 1, the number of symmetrical codes with length L, denoted by $m_0(L)$, is calculated as follows:

$$m_0(L) = 2^{\lfloor (L+1)/2 \rfloor} \quad (1)$$

where $\lfloor x \rfloor$ denotes the ceiling function, which is the smallest integer or equal to x. The relation between L and $m_0(L)$ determined by equation (1) is illustrated in Table 1.

| L | 1 | 2 | 3 | 4 | 5 | 6 | 7 | 8 |
|---|---|---|---|---|---|---|---|---|
| $m_0(L)$ | 2 | 2 | 4 | 4 | 8 | 8 | 16 | 16 |

Not all of the symmetrical codes decided by equation (1) satisfy the instantaneous decoding condition. The symmetrical codes that satisfy the prefix condition and the suffix condition belong to those defined in m(L). Refer to the binary tree shown in FIG. 1 and consider a path from the root R to a leaf node at level L, such as the path 1a -2a -3a -4a -5a. In such a path, the codes corresponding to the nodes in the head are the prefix of the codes corresponding to the nodes in the tail. In other words, only one node can be selected as a candidate in a path. Selecting two or more nodes in a path can result in the violation of the prefix condition. Therefore, m(L) can be derived from $m_0(L)$ by deleting the nodes that could violate the prefix condition. Let u(i,L) denotes the number of symmetrical codes with length L that violate the prefix condition when a node at the i-th level is selected as a candidate. There are three different cases.

(a) $u(i,L) = m_0(L-2i)$, when $i \leq L/2$;
(b) $u(i,L) = 1$ or 0, when $L/2 < i < L$;
(c) $u(i,L) = 0$, in all other cases.

According to conditions (a), (b) and (c), the number of symmetrical codes with length L that can be assigned to an instantaneously decodable VLC, denoted by m(L), is given as follows:

$$m(L) = m_0(L) - \sum_{i=1}^{\lfloor L/2 \rfloor} u(i, L) \cdot n(i) - \sum_{i=\lfloor L/2 \rfloor+1}^{L-1} x(i, L) \quad (2)$$

where n(i) denotes the number of codewords with length i in the original VLC and x(i,L) denotes the number of codewords with length i whose (2i−L) suffixes are symmetrical. In equation (2), the second term and the third terms are used to calculate the total number of symmetrical codes due to the violation of the prefix condition in case (a) and case (b), respectively.

Therefore, the symmetrical codes with length L which satisfy the instantaneous decoding condition, denoted by m(L), can be acquired by deleting the codewords that violate the prefix condition from the symmetrical codewords with length L, denoted by $m_0(L)$.

The symmetrical RVLC algorithm proposed by Takishima et al. derives a RVLC from an original VLC, such as the Huffman code, by using the function m(L).

Step 1:

The bit length vector $n_{rev}(i)$ of the target RVLC is initialized to be the bit length vector n(i) of the original VLC (such as the Huffman code). The component of a bit length vector indicates the number of the codewords with length i. Accordingly, $n_{rev}(i)=n(i)$.

Step 2:

For every i, the condition $n_{rev}(i) \leq m(i)$ is examined, where $n_{rev}(i)$ denotes the number of the codewords with length i and m(i) denotes the number of the symmetrical codes with length i which satisfy the instantaneous decoding condition. Accordingly, when $n_{rev}(i) \leq m(i)$, it means that the number of the symmetrical codes is enough to be assigned to the codewords with length i in the target RVLC. When the condition is not satisfied, it means that the assignment requires the codes with length i+1. At this time, the bit length vector $n_{rev}(i)$ of the target RVLC must be adjusted:

$$n_{rev}(i+1)=n_{rev}(i+1)+n_{rev}(i)-m(i) \quad (3)$$

$$n_{rev}(i)=m(i) \quad (4)$$

In equation (4), $n_{rev}(i)$ is set to be the maximal possible number, m(i). The other unassigned codewords with length i (that is, $n_{rev}(i)-m(i)$) are assigned by the codes with length i+1. It is noted that m(i) does not only depend on the bit length vector $n_{rev}(i)$, but also on the bit alignment pattern of each codeword in the original VLC.

Step 3:

Step 2 is repeated until every codeword has been assigned.

In the conventional Takishima's algorithm, there are three terms in equation (2) for determining m(L). The first and second terms are determined only by the code length L and the bit length vector n(i), while the last term depends on the bit alignment pattern of each codeword. This indicates the fact that a symmetrical RVLC with a different bit length vector can be generated from VLCs with an identical bit length vector but different bit alignment patterns. In practice, the bit length vector can make extensive influence on coding efficiency. It is evident that using codewords with shorter bit lengths may make the average length shorter. Accordingly, the first drawback of the conventional algorithm is that the coding efficiency, which depends on the bit alignment patterns of codewords in the original VLC, is hard to control. In addition, since the bit alignment patterns of the codewords should be considered, the prefix or suffix condition is easily violated during the assigning of the symmetrical codewords. This is the second drawback of the conventional Takishima's algorithm.

SUMMARY OF THE INVENTION

Therefore, an object of the present invention is to provide a method of generating a symmetrical reversible variable length code, which is not influenced by the bit alignment pattern of the original VLC codewords, thereby improving the coding efficiency.

The present invention achieves the above-indicated objects by providing a method of generating a symmetrical reversible variable length code, comprising the steps of: choosing an original variable length code with a bit length vector, each component of which indicates the number of codewords with the same codeword length; determining a set of symmetrical codes having a plurality of subsets containing codes with the same code lengths; presetting the numbers of codewords with the same codeword lengths in the symmetrical reversible variable length code according to the bit length vector of the original variable length code; sequentially determining available symmetrical codes satisfying a selection criterion from the subsets of the set of the symmetrical codes in the order of increasing the code length; entirely assigning the available symmetrical codes to the symmetrical reversible variable length code and adding the difference of the number of the codewords with the same codeword length as that of the available symmetrical codes in the symmetrical reversible variable length code and the number of the available symmetrical codes to the number of the codewords with the codeword length larger than that of the available symmetrical codes by one, when the number of the codewords with the same codeword length as that of the available symmetrical codes in the symmetrical reversible variable length code is larger than the number of the available symmetrical codes; and selectively assigning the available symmetrical codes to the symmetrical reversible variable length code according to selection priorities of the available symmetrical codes when the number of codewords with the same codeword length as that of the available symmetrical codes is not larger than the number of the available symmetrical codes.

In addition, the selection criterion is that the suffix of the available symmetrical codes does not include the assigned symmetrical codes. In addition, the selection priority of the available symmetrical code is inversely proportional to a maximal symmetrical suffix length of the available symmetrical code.

Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE DRAWINGS

The following detailed description, given by way of example and not intended to limit the invention solely to the embodiments described herein, will best be understood in conjunction with the accompanying drawings, in which:

FIG. 4 is a diagram showing the coding property of various coding schemes by processing the alphabetic letters.

DETAILED DESCRIPTION OF THE PREFERRED EMBODIMENTS

The symmetrical RVLC algorithm proposed in the present invention eliminates the variation of codeword lengths caused by different bit alignment patterns in the conventional Takishima's algorithm, thereby providing a symmetrical RVLC with higher coding efficiency. This new symmetrical RVLC is still derived from a VLC, such as the Huffman code, but the generating process only employs the bit length vector and does not involve the codewords of the VLC. In other words, the symmetrical RVLC generated by this scheme is not influenced by the bit alignment patterns of codewords of the original VLC.

Figure 1:
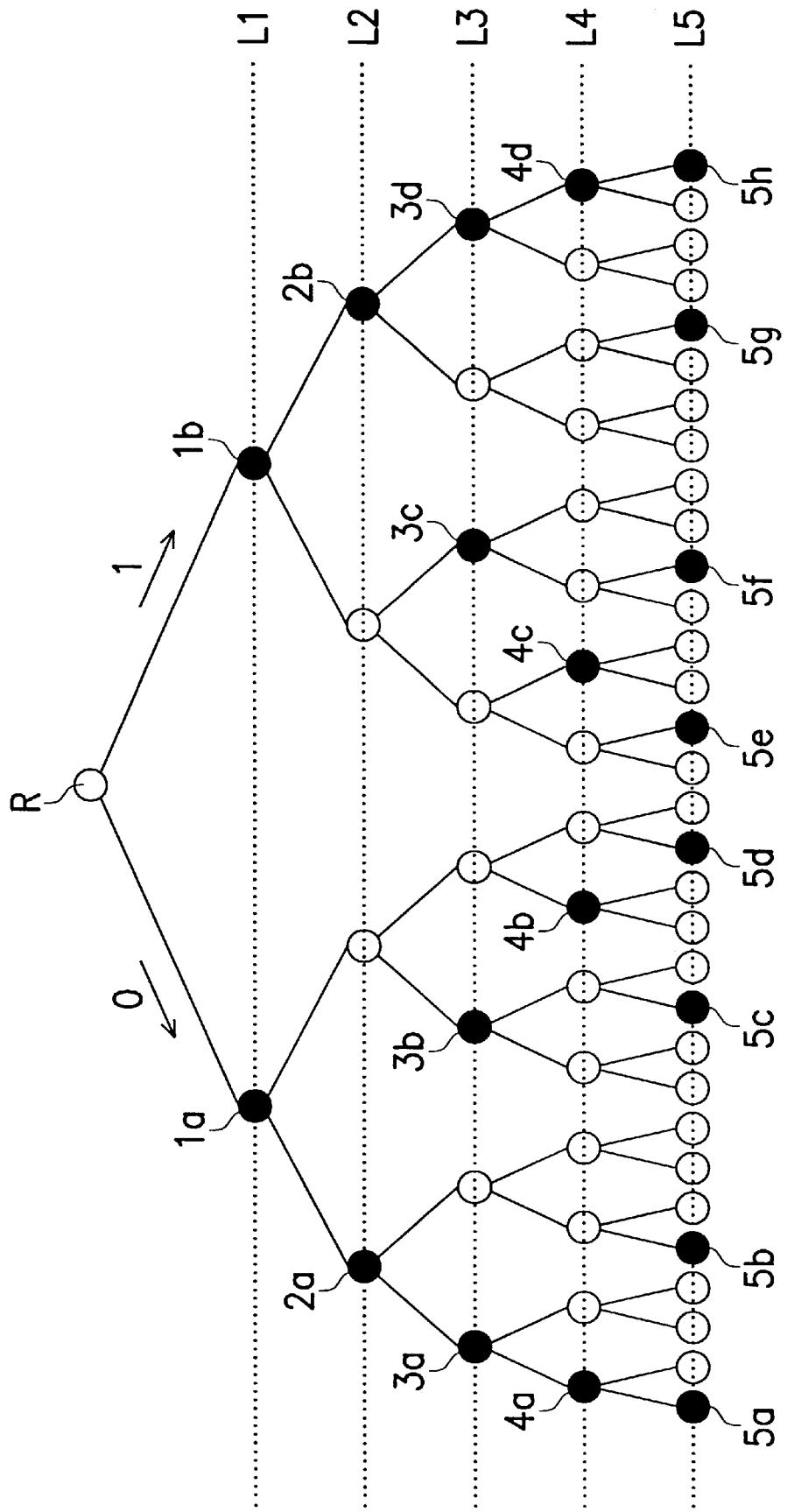
FIG. 1 (Prior Art) is a diagram of a binary tree for illustrating symmetrical and non-symmetrical codes.
Figure 2:
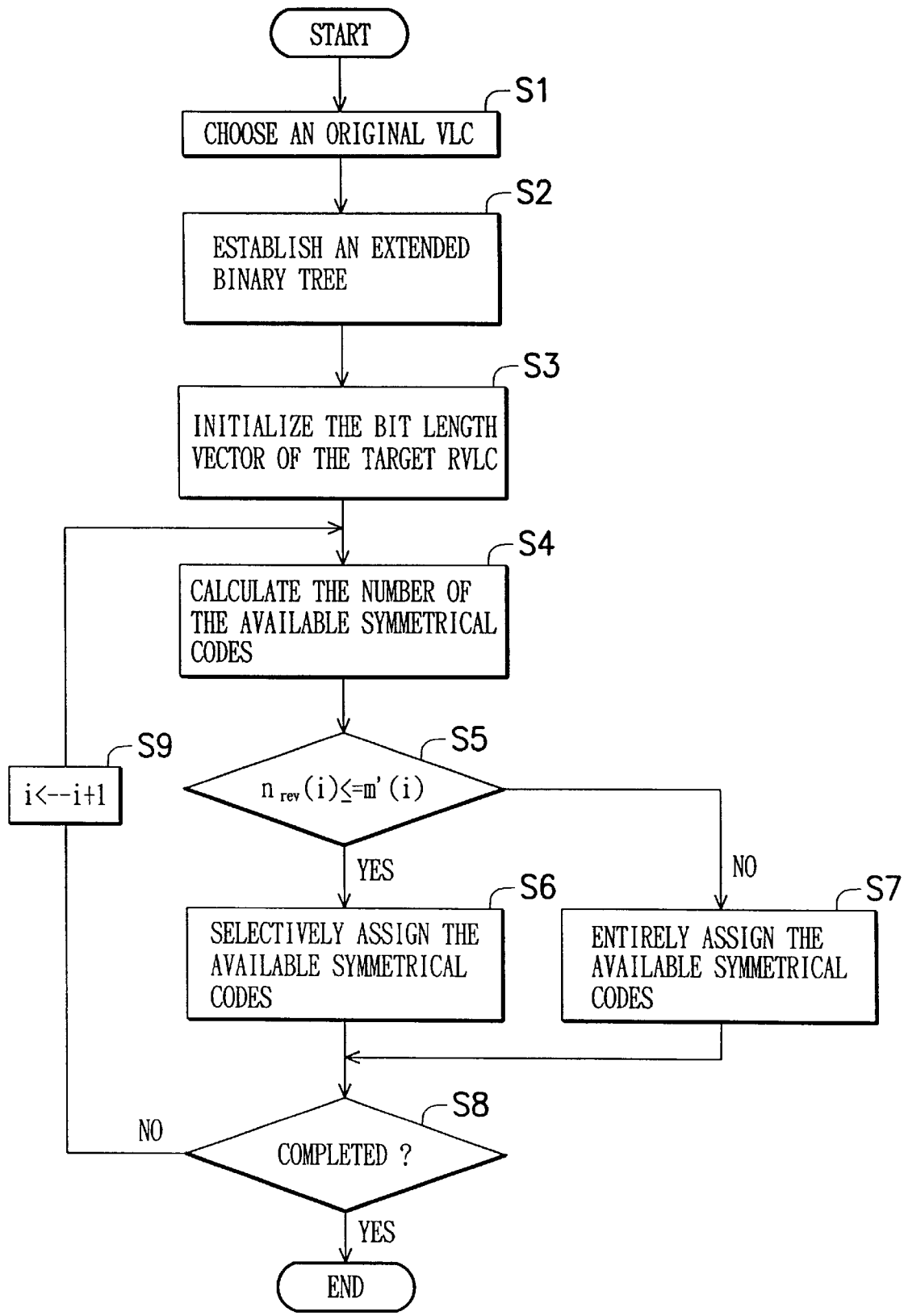
FIG. 2 is a flowchart of the method of generating a symmetrical RVLC in the embodiment of the present invention.

FIG. 2 is a flowchart of the method of generating a symmetrical RVLC in this embodiment. These steps of the method are described in detail as follows.

Before proceeding to generate the symmetrical RVLC, an original VLC is selected first (S1). As described above, in the following processing, only the bit length vector of the original VLC is employed and the bit alignment patterns of these codewords in the original VLC are not necessary. The bit length vector is used to indicate the number of the codewords with various bit lengths in the corresponding coding system. For example, the Huffman code can employ 26 codewords to represent the alphabetical letters in English. The occurrences of each letter can determine the bit length of the corresponding codeword. If its bit length vector is {0, 0, 2, 7, 7, 5, 1, 1, 1, 2}, it means that the number of the codewords with 3 bits is 2 and the number of the codewords with 4 bits is 7, and so on. The maximal codeword length is 10 bits.

Figure 3:
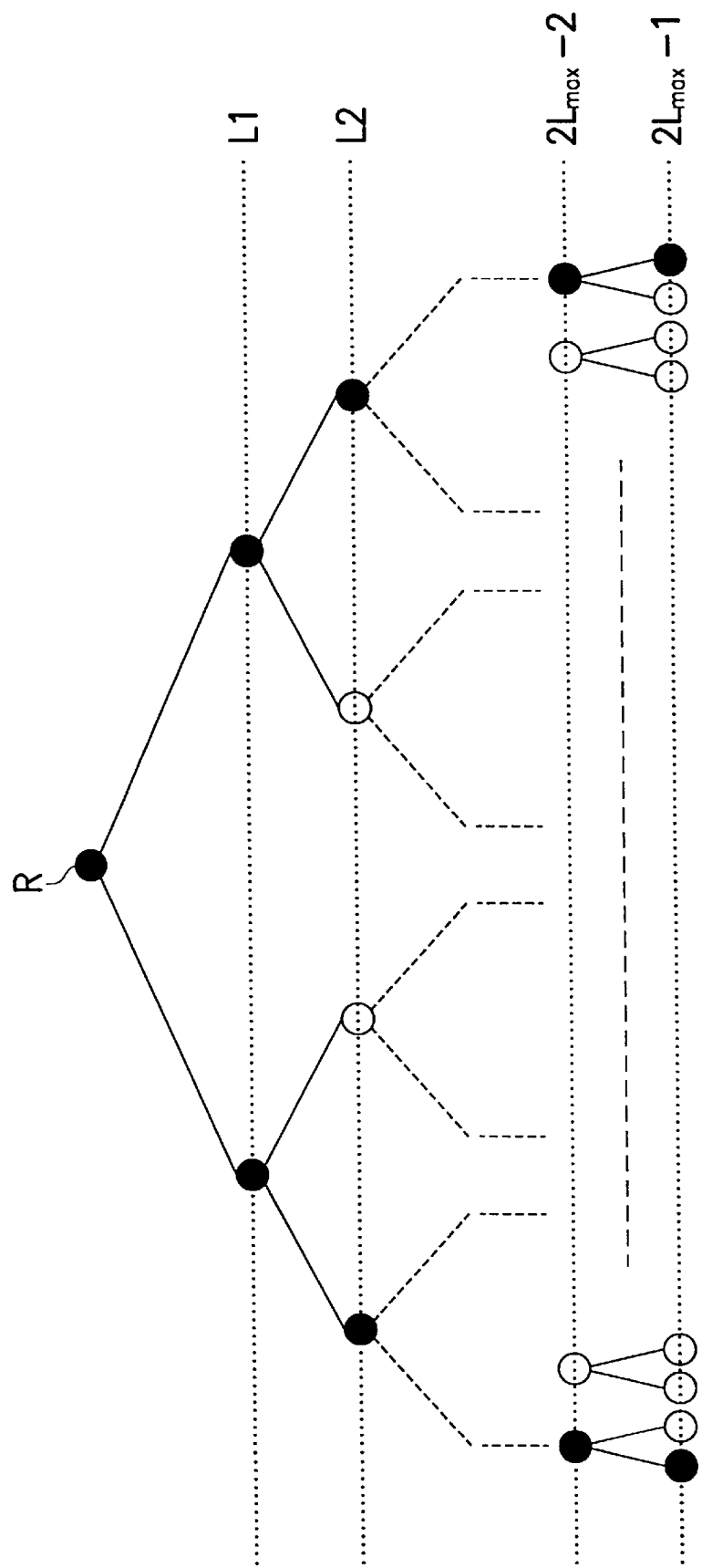
FIG. 3 is a diagram of an extended binary tree employed in the embodiment of the present invention, where the level number of the extended binary tree is $2L_{max}-1$ and $L_{max}$ denotes the maximal codeword length in the original VLC.

Next, an extended binary tree, in which all symmetrical codes are marked, is established as shown in FIG. 3 (S3). The level number of the extended binary tree is $2L_{max}-1$, where $L_{max}$ is the maximal codeword length of the original VLC and thus $2L_{max}-1$ will be the upper bound of the codeword length of the target RVLC.

The bit length vector $n_{rev}(i)$ of the target RVLC is initialized to be the bit length vector n(i) of the original VLC (S3). This operation can be expressed by $n_{rev}(i)<=n(i)$. After the initialization operation is performed, the assignment operation of the symmetrical codewords proceeds.

Codeword assignment is performed from the lower levels to the higher levels until all codewords are assigned. In the example of the alphabetic letters, the assignment operation begins at i=3. Then the symmetric codes in the subsequent levels are sequentially assigned to the corresponding codewords until all codewords are assigned. The total number of available symmetrical codewords in level i, denoted by m' (t), is calculated first by equation (5):

$$m'(i)=m_0(i)-p(i) \tag{5}$$

where $m_0(t)$ denotes the total number of the symmetrical codewords in level i (the nodes of which corresponds to the codewords with length i). $m_0(t)$ can be obtained by:

$$m_0(i)=2^{\lfloor(i+1)/2\rfloor} \tag{6}$$

p(i) denotes the total number of the symmetrical codes located at level i that violate the prefix condition due to some symmetrical codewords positioned in the path from the root to the symmetrical codes at level i that have been selected as target symmetrical codewords. p(i) is expressed by:

$$p(i) = \sum_{k=1}^{\lfloor i/2 \rfloor} u(k, i) \cdot n_{rev}(k) + \sum_{k=\lfloor i/2 \rfloor+1}^{L-1} x(k, i) \tag{7}$$

Equation (7) is different to equation (2) in the prior art, especially in the second term, which is relevant to the bit alignment patterns of the codewords of the target RVLC that have been selected. In the conventional case, the corresponding term is relevant to the bit alignment patterns of the codewords of the original VLC. In other words, the bit alignment patterns of the VLC codewords are unnecessary in this embodiment.

Next, the number of available symmetrical codes m'(t) is compared with the component of the bit length vector $n_{rev}(i)$ in level i (S5). If $n_{rev}(i)$ is less than or equal to m'(i), that is, $n_{rev}(i) \leq m'(t)$, it means that all codes in this level can be assigned to be the corresponding codewords. Since the extended binary tree has been established, the symmetrical codes that have been selected and assigned should be marked in the extended binary tree. In this case, there are more available symmetric codes. Therefore, the selection criterion plays an important role in coding efficiency. In this embodiment, the selection priority is determined by the maximum length of the symmetrical bit suffix b(i) of each symmetrical code (S6). The maximum length of the symmetrical bit suffix b(i) means the length of the maximal symmetrical suffix not including the most significant bit (MSB) of each candidate code. For example, the maximal symmetrical suffix of the symmetrical codeword "01110" is "0" and b(i)=1. In addition, the maximal symmetrical suffix of the symmetrical code "01010" is "010" and b(i)=3. It is noted that a symmetrical code has the same maximal symmetrical prefix and suffix due to its symmetry property. It is evident that the maximal symmetrical prefix also can be applied in this embodiment. The symmetrical code with larger b(i) has a lower priority and the symmetrical codeword with smaller b(i) has a higher priority. For the symmetrical codes "01110" and "01010", the code "01110" has a higher priority.

The selection criteria can be explained as follows. Suppose that a symmetrical codeword at level λ is needed. There are two candidate codes C and C' that can be selected, where the maximal symmetrical suffix length b(i) of the first candidate code C is r and the maximal symmetrical suffix length b(i) of the second candidate code C' is t. In addition, t >r. If the first candidate code C is selected, the prefix condition violation due to the codeword C will occur earliest at level 2λ-r. Similarly, if the second candidate code C' is selected, the prefix condition violation due to the codeword C' will occur earliest at level 2λ-t. Since 2λ-r>2λ-t, the selection of codeword C' may make a symmetrical code invalid at lower levels and the selection of codeword C may make a symmetrical code invalid at higher levels, it is evident that making a shorter code invalid will increase the average code length. Accordingly, it is reasonable that the codeword with larger b(i) has a low priority. Consider the codes "01110" and "01010". Since the b(i) of the code "01110" is 1, the selection of this code may make the code "011101110" at level 9 invalid. Since the b(i) of the code "01010" is 3, the selection of this code may make the code " 0101010" at level 7 invalid. Accordingly, the code "01110" has a higher selection priority.

Another case is that in which $n_{rev}(i)>m'(i)$, meaning that all available symmetric codes in the level i can be assigned to be the corresponding codewords. However, there are $(n_{rev}(i)-m'(i))$ symmetrical codewords in the level i that cannot be fully assigned. Therefore, these unassigned ones are left to the next level (ie, the level i+1) to find appropriate codes that can be assigned. At this time, the bit length vector $n_{rev}(i)$ of the target RVLC needs to be adjusted (S7):

$$n_{rev}(i+1)=n_{rev}(i+1)+n_{rev}(i)-m'(i \quad (8)$$

$$n_{rev}(i)=m'(i \quad (9)$$

If all of the desired assignment operations have finished, the generation process of the symmetrical RVLC is completed. If not, the next level is processed, denoted by i←i+1, and the steps S4~S7 are repeatedly performed until all symmetrical codewords are properly assigned.

The most significant improvements of the symmetrical RVLC method disclosed in the present invention over the conventional Takishima's algorithm is that: (1) the generating method is independent of the bit alignment pattern of the original VLC; and (2) the generating method has organized the possible codewords in a predefined order. As a result, the generating method of the present invention has less chance of violating the prefix condition than that of the prior art. Accordingly, there are more symmetrical codewords for selection and the overall coding efficiency is improved.

A practical example is described for illustrating the advantages of the present invention. FIG. 4 is a table illustrating several coding examples of the alphabetic letters by using the Huffman code, the RVLC generated by the conventional Takishima's algorithm, and the RVLC generated by the algorithm of the present invention, respectively. In FIG. 4, these alphabetic letters are listed in an order of occurrences. In addition, there are five coding examples illustrated. C1 denotes a non-reversible Huffman code. C2 and C3 denotes the RVLCs generated from C1 by using the Takishima's algorithm and the present invention, respectively. C4 denotes another non-reversible Huffman code, which has the same bit length vector as that of C1 (that is, {0,0,2,7,7,5,1,1,1,2}), but different bit alignment patterns. C5 denotes the RVLC generated from C4 by using the present invention. Average code lengths of these coding systems are also shown. According to FIG. 4, the advantages of the present invention are that:

(1) The generated RVLC is independent of the bit alignment patterns of the original Huffman code. In other words, using the original Huffman codes with the same bit length vector, such as C1 and C4, can generate the same RVLC.

(2) The coding efficiency is improved. Generally speaking, the average code length should be a fair index of the coding efficiency. FIG. 4 shows that C2 employing the conventional Takishima's algorithm has 13.0% longer average code length than that of C1. In addition, C2 and C5 have 10.8% longer average code length than C1 and C4, indicating that the proposed algorithm has better coding efficiency than Takishima's algorithm.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of generating a symmetrical reversible variable length code, comprising the steps of:

choosing an original variable length code with a bit length vector, each component of which indicates the number of codewords with the same codeword length;

determining a set of symmetrical codes having a plurality of subsets containing codes with the same code lengths;

presetting the numbers of codewords with the same codeword lengths in the symmetrical reversible variable length code according to the bit length vector of the original variable length code;

sequentially determining available symmetrical codes satisfying a selection criterion from the subsets of the set of the symmetrical codes in the order of increasing the code length;

assigning all the available symmetrical codes to the symmetrical reversible variable length code and adding the difference of the number of the codewords with the same codeword length as that of the available symmetrical codes in the symmetrical reversible variable length code and the number of the available symmetrical codes to the number of the codewords with the codeword length larger than that of the available symmetrical codes by one, when the number of the codewords with the same codeword length as that of the available symmetrical codes in the symmetrical reversible variable length code is larger than the number of the available symmetrical codes; and selectively assigning the available symmetrical codes to the symmetrical reversible variable length code according to selection priorities of the available symmetrical codes when the number of codewords with the same codeword length as that of the available symmetrical codes is not larger than the number of the available symmetrical codes.

2. The method as recited in claim 1, wherein the maximal codeword length of the original variable length code is $L_{max}$ and the maximal code length of the set of the symmetrical codes is $2L_{max}-1$.

3. The method as recited in claim 1, wherein the selection criterion is that the suffix of the available symmetrical codes does not include the assigned symmetrical codes.

4. The method as recited in claim 1, wherein the original variable length code is a Huffman code.

5. The method as recited in claim 1, wherein the selection priority of the available symmetrical code is inversely proportional to a maximal symmetrical suffix length of the available symmetrical code.

* * * * *